(12) United States Patent
Sasaki et al.

(10) Patent No.: US 8,367,449 B2
(45) Date of Patent: Feb. 5, 2013

(54) SEMICONDUCTOR LIGHT-EMITTING APPARATUS AND METHOD OF MANUFACTURING THE SAME

(75) Inventors: Chiharu Sasaki, Tokyo (JP); Wataru Tamura, Tokyo (JP); Keita Akiyama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 136 days.

(21) Appl. No.: 13/026,564

(22) Filed: Feb. 14, 2011

(65) Prior Publication Data
US 2011/0198634 A1 Aug. 18, 2011

(30) Foreign Application Priority Data
Feb. 16, 2010 (JP) ................................ 2010-031295

(51) Int. Cl.
*H01L 31/00* (2006.01)
*H01L 21/00* (2006.01)

(52) U.S. Cl. ............... 438/46; 257/94; 257/E33.013; 257/E33.048; 438/45

(58) Field of Classification Search ............... 438/45, 438/46; 257/94, E33.031, E33.048
See application file for complete search history.

(56) References Cited

FOREIGN PATENT DOCUMENTS
JP 2007-042751 A 2/2007

*Primary Examiner* — Marcos D. Pizarro
*Assistant Examiner* — Eva Yan Montalvo
(74) *Attorney, Agent, or Firm* — Holtz, Holtz, Goodman & Chick, PC

(57) ABSTRACT

A semiconductor light-emitting apparatus that has high luminous efficiency and a high breakdown voltage as well as reduced breakdown voltage variation among lots. The semiconductor light-emitting apparatus includes a first clad layer and a second clad layer. An average dopant concentration of the second clad layer is lower than that of the first clad layer. The light-emitting apparatus also includes an active layer having an average dopant concentration of $2 \times 10^{16}$ to $4 \times 10^{16}$ cm$^{-3}$. The active layer is made of $(Al_yGa_{1-y})_xIn_{1-x}P$ ($0<x\leq 1$, $0 \leq y \leq 1$). The light-emitting apparatus also includes a third clad layer, and a second-conducting-type semiconductor layer made of $Ga_{1-x}In_xP$ ($0 \leq x<1$). If d is the layer thickness of the second clad layer (nm) and $N_{d1}$ is the average dopant concentration of the second clad layer (cm$^{-3}$), then $d \geq 1.2 \times N_{d1} \times 10^{-15} + 150$ is satisfied.

22 Claims, 6 Drawing Sheets

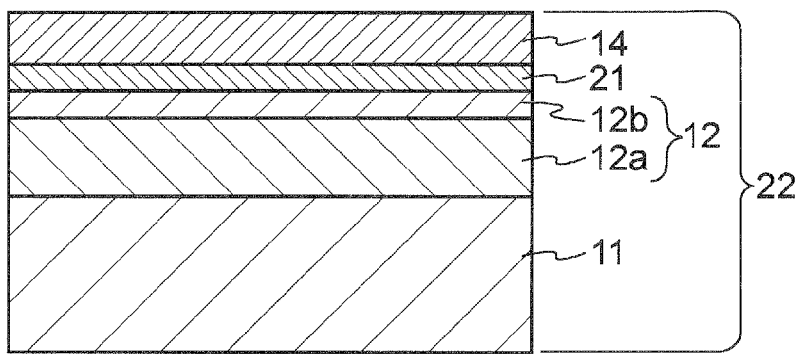
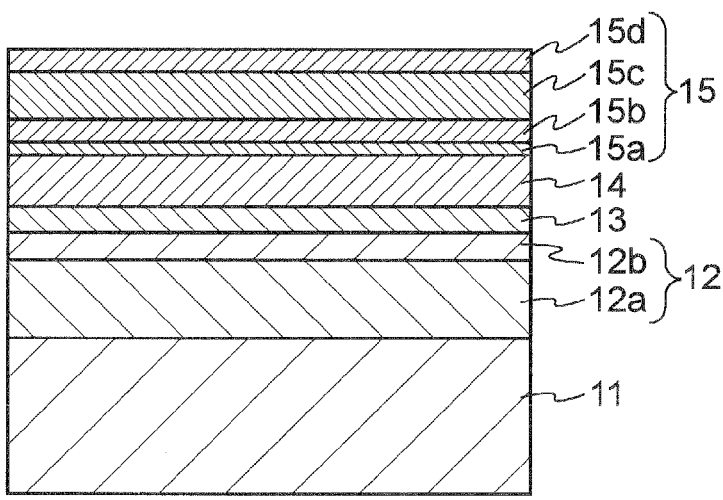
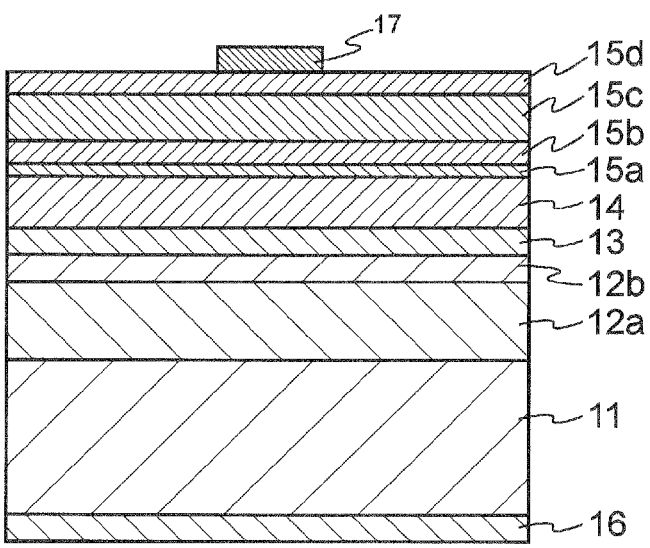

SEMICONDUCTOR LIGHT-EMITTING APPARATUS AND METHOD OF MANUFACTURING THE SAME

BACKGROUND OF THE INVENTION

The present invention relates to a semiconductor light-emitting apparatus and a manufacturing method thereof, and more particularly relates to a semiconductor light-emitting apparatus that employs a technique of depositing a plurality of semiconductor layers on a semiconductor substrate and a manufacturing method of such light-emitting apparatus.

SUMMARY OF THE INVENTION

Various methods for making semiconductor light-emitting apparatus are known in the art. One of such methods includes sequentially depositing a plurality of semiconductor layers on a GaAs substrate that is used as a substrate for growth. The depositing is carried out by MOCVD (Metal Organic Chemical Vapor Deposition). For example, an n-type clad layer, an active layer, a p-type clad layer, and a p-type current spreading layer are sequentially deposited on the GaAs substrate. A surface (or front) electrode is provided on the current spreading layer. A back electrode is formed on an opposite side of the face of the GaAs substrate that has the n-type clad layer formed thereon (that is the back face of the GaAs substrate).

The semiconductor light-emitting apparatus are often used in taillights of an automobile. The semiconductor light-emitting apparatus are also used as back lights for various indicating devices and mobile devices such as portable telephones. Use of the semiconductor light-emitting apparatus expands to headlights of an automobile, backlights of a liquid crystal display and house-use lighting equipment. With the expansion of the market of the semiconductor light-emitting apparatus, improvements on the luminous efficiency and reliability of the semiconductor light-emitting apparatus are desired.

As to the reliability improvements, there is a demand for suppression of the time-dependent change of the breakdown voltage upon application of a reverse bias to the semiconductor light-emitting apparatus. It is said that the breakdown voltage is caused by diffusion due to energizing, of an impurity (for example, Zn, or Mg) used in p-type doping. From this viewpoint, a technique is known of suppressing the variation with time of the breakdown voltage by not doping any impurity between the active layer and an intervening layer or by inserting therebetween a dopant suppression layer whose impurity concentration is low. For example, Japanese Patent Application Publication (Kokai) No. 2007-42751 discloses a technique of inserting a dopant suppression layer into the p-type clad layer. This dopant suppression layer contains no impurity (referred to as "undoped layer" or "no-doped layer").

In recent years, even higher brightness and even higher reliability are demanded to semiconductor light-emitting apparatus. As to the higher reliability, it is desired to increase the breakdown voltage of the semiconductor light-emitting apparatus and reduce manufacturing tolerance of the breakdown voltage among a plurality of lots of semiconductor light-emitting apparatuses (differences in breakdown voltage among lots).

One object of the present invention is to provide a semiconductor light-emitting apparatus that has high luminous efficiency and a high breakdown voltage with smaller manufacturing tolerance among lots.

Another object of the present invention is to provide a method of manufacturing a semiconductor light-emitting apparatus that has high luminous efficiency and a high breakdown voltage with smaller manufacturing tolerance among lots.

According to a first aspect of the present invention, there is provided a semiconductor light-emitting apparatus that includes a first clad layer formed on a semiconductor substrate and a second clad layer formed on the first clad layer. The first clad layer has a first conducting type, and the second clad layer also has the first conducting type. An average dopant concentration of the second clad layer is lower than that of the first clad layer. The semiconductor light-emitting apparatus also includes an active layer formed on the second clad layer. The active layer has an average dopant concentration of $2 \times 10^{16}$ to $4 \times 10^{16}$ cm$^{-3}$, and is made from $(Al_yGa_{1-y})_xIn_{1-x}P$ ($0 < x \leq 1$, $0 \leq y \leq 1$). The semiconductor light-emitting apparatus also includes a third clad layer formed on the active layer. The third clad layer has a second conducting type. The semiconductor light-emitting apparatus also includes a second-conducting-type semiconductor layer formed on the third clad layer and made from $Ga_{1-x}In_xP$ ($0 \leq x < 1$). If the layer thickness of the second clad layer is denoted as "d" (nm) and the average dopant concentration of the second clad layer as "$N_{d1}$" (cm$^{-3}$), then a relation "$d \geq 1.2 \times N_{d1} \times 10^{-15} + 150$" is satisfied.

The dopant concentration of the second clad layer may be $5 \times 10^{17}$ cm$^{-3}$ or lower. Alternatively, the dopant concentration of the second clad layer may be $1 \times 10^{16}$ to $2 \times 10^{17}$ cm$^{-3}$.

The dopant concentration of the first clad layer may be $1 \times 10^{18}$ to $5 \times 10^{18}$ cm$^{-3}$.

The total of layer thickness of the first and second clad layers may be one micrometer or greater. The dopant concentrations of the active layer, the third clad layer, and the second-conducting-type semiconductor layer may decrease from the second-conducting-type semiconductor layer toward the active layer. The second-conducting-type semiconductor layer may have a four-layer structure, with four layers having different Zn concentrations from each other.

According to a second aspect of the present invention, there is provided a method of manufacturing a semiconductor light-emitting apparatus. The manufacturing method includes the step of forming a multilayered structure by sequentially growing a first clad layer, a second clad layer, an active layer and a third clad layer. The first clad layer is formed on a substrate for growth. The first clad layer has a first conducting type. The second clad layer has the first conducting type and has an average dopant concentration that is lower than that of the first clad layer. The active layer is not doped, and is made from $(Al_yGa_{1-y})_xIn_{1-x}P$ ($0 < x \leq 1$, $0 \leq y \leq 1$). The third clad layer has a second conducting type. The manufacturing method also includes the step of controlling the average dopant concentration of the active layer to be between $2 \times 10^{16}$ and $4 \times 10^{16}$ cm$^{-3}$ by growing a second-conducting-type semiconductor layer at a growth temperature that is higher than the growth temperature of the multilayered structure and causing the dopant of the second conducting type to diffuse from the second clad layer to the active layer. If the layer thickness of the second clad layer is denoted as "d" (nm) and the average dopant concentration of the second clad layer as "$N_{d1}$ (cm$^{-3}$)", then the second clad layer is formed to satisfy a relation of "$d \geq 1.2 \times N_{d1} \times 10^{-15} + 150$".

The clad layer of the first conducting type is configured by the first clad layer and the second clad layer having the average dopant concentration that is lower than that of the first clad layer. The layer thickness d (nm) of the second clad layer and the average dopant concentration $N_{d1}$ (cm$^{-3}$) of the second clad layer satisfy the equation "d≧1.2×$N_{d1}$×$10^{-15}$+150". Therefore, a constant breakdown voltage is obtained without depending on the layer thickness of the second clad layer.

The average dopant concentration of the active layer is 2×$10^{16}$ to 4×$10^{16}$ cm$^{-3}$ and therefore a high luminous efficiency results.

The semiconductor light-emitting apparatus of the present invention includes the above-described structure and, therefore, has high luminous efficiency and a high breakdown voltage. Also, the semiconductor light-emitting apparatus has a reduced variation (tolerance) of the breakdown voltage among lots. The manufacturing method of the semiconductor light-emitting apparatus of the present invention are carried out to create the above-described structures and therefore the resulting semiconductor light-emitting apparatus has high luminous efficiency and a high breakdown voltage as well as reduced variation in the breakdown voltage among lots.

These and other objects, aspects and advantages of the present invention will become apparent to those skilled in the art from the following detailed description when read and understood in conjunction with the appended claims and drawings.

BRIEF DESCRIPTION OF THE DRAWINGS

FIGS. 2A to 2D are a series of cross-sectional views of manufacturing process steps for the semiconductor light-emitting apparatus shown in FIG. 1;

DETAILED DESCRIPTION OF THE INVENTION

Exemplary embodiments of the present invention will now be described in detail with reference to accompanying drawings.

The structure and a manufacturing method of a semiconductor light-emitting apparatus according to one embodiment of the present invention will be described with reference to FIGS. 1 to 3.

Figure 1:
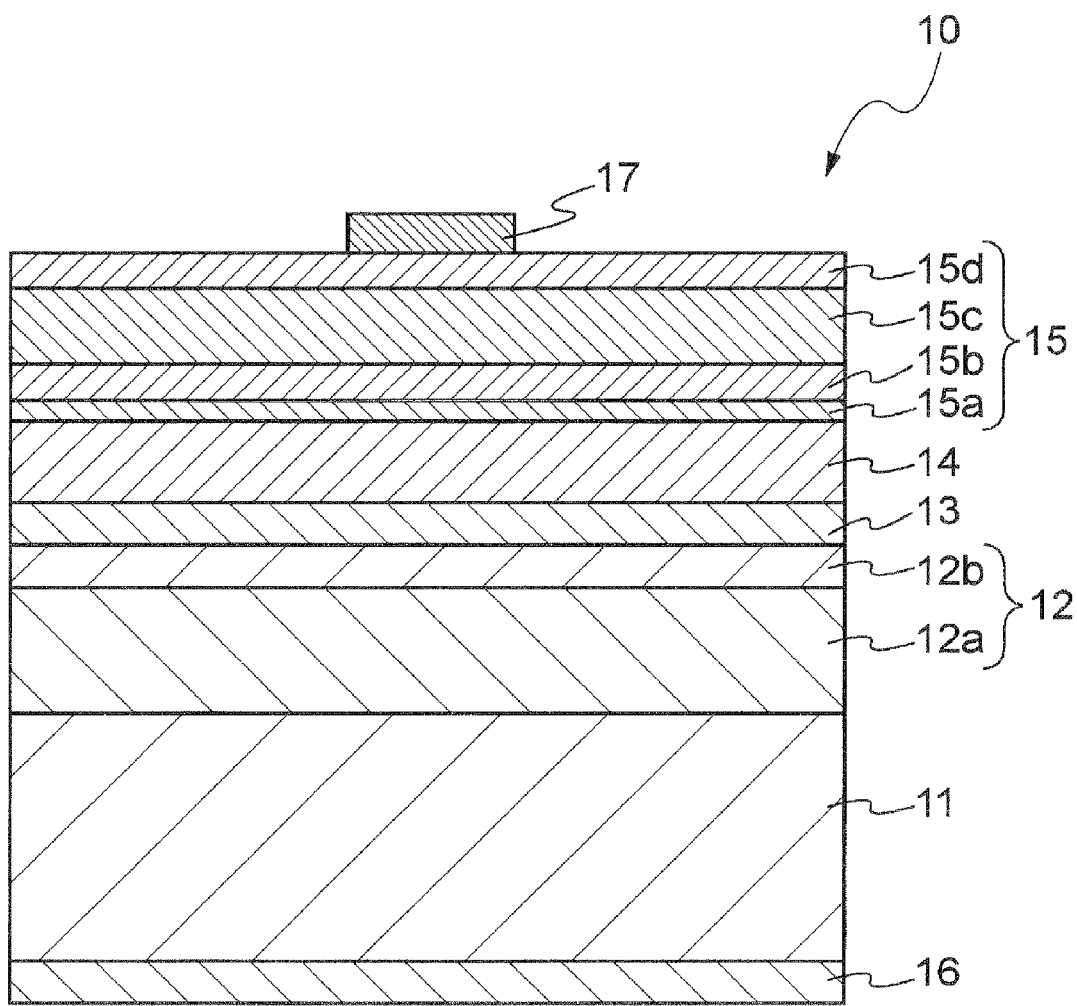
FIG. 1 is a cross-sectional view of a semiconductor light-emitting apparatus according to an embodiment of the present invention.

FIG. 1 is a cross-sectional diagram of the semiconductor light-emitting apparatus 10 according to the embodiment of the present invention. As shown in FIG. 1, the semiconductor light-emitting apparatus 10 includes an n-type clad layer 12, an active layer 13, a p-type clad layer 14, and a p-type current spreading layer 15 that are sequentially deposited on the upper surface (main face) of an n-type GaAs substrate 11. The substrate 11 is a substrate for growth. The semiconductor light-emitting apparatus 10 also includes an n-side electrode 16 over the whole face on the opposite side to the upper face having the n-type clad layer 12 formed thereon (that is, the back face) of the n-type GaAs substrate 11. The semiconductor light-emitting apparatus 10 also includes a p-side electrode 17 in the central portion on the p-type current spreading layer 15.

The n-type clad layer 12 has a two-layer structure that is configured by a high-concentration n-type clad layer 12a and a low-concentration n-type clad layer 12b whose impurity concentration is lower than that of the high-concentration n-type clad layer 12a. The n-type clad layer 12 is disposed such that the low-concentration n-type clad layer 12b contacts the active layer 13. The layer thickness of the high-concentration n-type clad layer 12a is 2.5 μm (micrometer) and the layer thickness of the low-concentration n-type clad layer 12b is 0.5 μm.

The p-type current spreading layer 15 is configured by four layers having layer thicknesses and impurity concentrations that are different from each other. Specifically, a first diffusion portion 15a, a second diffusion portion 15b, a third diffusion portion 15c, and a junction portion 15d are sequentially deposited on the p-type clad layer 14 to create the current spreading layer 15. The layer thickness of the first diffusion portion 15a is about 0.1 μm. The layer thickness of the second diffusion portion 15b is 0.9 μm. The layer thickness of the third diffusion portion 15c is 8.5 μm. The layer thickness of the junction portion 15d is 0.5 μm.

The manufacturing method of the semiconductor light-emitting apparatus 10 including the above-described structure will be described with reference to FIG. 2A to FIG. 2D.

The n-type GaAs substrate 11 that is the substrate for the growth is first prepared (FIG. 2A). In this embodiment, silicon (Si) is doped in the n-type GaAs substrate 11 and the main face thereof is inclined by 15 degrees from its substrate orientation (100). The n-type GaAs substrate 11 is a 15-degree-off growth substrate.

The high-concentration n-type clad layer 12a, the low-concentration n-type clad layer 12b, the no-doped active layer 21, and the p-type clad layer 14 are sequentially deposited on the n-type GaAs substrate 11 by MOCVD (Metal Organic Chemical Vapor Deposition). Thus, a multilayered structure 22 is formed (FIG. 2B). The conditions for the growth are, for example, that the growth temperature is about 700 degrees C. and that the growth pressure is about 10 kPa. For example, trimethyl gallium (TMGa), trimethyl aluminum (TMAl), and trimethyl indium (TMI) are used as the materials (III-family materials) for the metal organic (MO) gases. Arsine ($AsH_3$) and phosphine ($PH_3$) are used as the V-family gases. The V/III ratio is between 30 and 200. For example, silane (SiH4) is used as an n-type dopant, and dimethyl zinc (DMZn) is used as a p-type dopant. Hydrogen is used as the carrier gas. The specific manufacturing process steps are as follows.

The high-concentration n-type clad layer 12a whose composition is ($Al_yGa_{1-y}$)$_x$$In_{1-x}$P (0<x≦1, 0≦y≦1) and whose Si concentration is about 1×$10^{18}$ cm$^{-3}$ is formed on the n-type GaAs substrate 11. The high-concentration n-type clad layer 12a has the layer thickness of about 2.5 μm. In the embodiment, the composition of the high-concentration n-type clad layer 12a is ($Al_{0.7}Ga_{0.3}$)$_{0.5}$$In_{0.5}$P.

The low-concentration n-type clad layer 12b whose composition is ($Al_yGa_{1-y}$)$_x$$In_{1-x}$P (0<x≦1, 0≦y≦1) and whose Si concentration is about 2×$10^{17}$ cm$^{-3}$ is formed on the high-concentration n-type clad layer 12a. The low-concentration n-type clad layer 12b has the layer thickness of about 0.5 μm.

In the embodiment, the composition of the low-concentration n-type clad layer 12b is $(Al_{0.7}Ga_{0.3})_{0.5}In_{0.5}P$.

Thus, the formation is completed of the n-type clad layer 12 that includes the high- and low-concentration n-type clad layers 12a and 12b. The high-concentration n-type clad layer 12a functions as a contact layer to provide a satisfactory (or necessary) contact with the n-type GaAs substrate 11.

The no-doped active layer 21 whose composition is $(Al_yGa_{1-y})_xIn_{1-x}P$ ($0 < x \leq 1$, $0 \leq y \leq 1$) and that has no impurity doped therein is formed on the low-concentration n-type clad layer 12b. The no-doped active layer 21 has the layer thickness of about 0.4 μm. The values of "x" and "y" are set such that the band gap of the no-doped active layer 21 is smaller than the band gaps of the n-type and the p-type clad layers 12 and 14. In the embodiment, the no-doped active layer 21 has a quantum well structure including a well layer whose composition is $(Al_{0.1}Ga_{0.9})_{0.5}In_{0.5}P$ and a barrier layer whose composition is $(Al_{0.5}Ga_{0.5})_{0.5}In_{0.5}P$ (20 pairs assuming that one pair of each layer thickness is 10 nm).

It should be noted that the undoped active layer 21 may have a single structure (bulk structure). The composition of the undoped active layer 21 is not limited to the composition mentioned in the embodiment. For example, the undoped active layer 21 may be an InGaP-based layer including no aluminum (that is, y is zero). The InGaP-based active layer can be an $In_{0.5}Ga_{0.5}P$ layer.

The p-type clad layer 14 whose composition is $(Al_yGa_{1-y})_xIn_{1-x}P$ ($0 < x \leq 1$, $0 \leq y \leq 1$) and that has Zn doped therein is formed on the undoped active layer 21. The p-type clad layer 14 has the layer thickness of about one μm. The amount of DMZn supplied is adjusted such that the average Zn concentration of the p-type clad layer 14 is about $5 \times 10^{17}$ $cm^{-3}$. In the embodiment, the composition of the p-type clad layer 14 is $(Al_{0.7}Ga_{0.3})_{0.5}In_{0.5}P$. The p-type clad layer 14 bears a role of increasing the luminous efficiency by confining therein the carriers (electrons) and, therefore, preferably its Al composition is adjusted to between 60% and 80% and more preferably to about 70% (between 65% and 75%). The formation of the multilayered structure 22 is thus completed.

Taking the critical film thickness of an AlGaInP film into consideration, it is preferred that the composition of the no-doped active layer 21 is $(Al_yGa_{1-y})_xIn_{1-x}P$ ($0.4 \leq x \leq 0.6$, $0 \leq y \leq 0.7$). When the growth temperature is set to be between 500 and 700 degrees C. (° C.), it is preferred that the composition of each of the n-type and the p-type clad layers 12 and 14 is $(Al_yGa_{1-y})_xIn_{1-x}P$ ($0.45 \leq x \leq 0.55$, $0.3 \leq y \leq 1$) taking into consideration that the AlGaInP-based multilayered structure 22 is caused to suit for the n-type GaAs substrate 11.

The p-type current spreading layer 15 that is configured by a material whose composition is $Ga_{1-x}In_xP$ ($0 \leq x < 1$) and that has Zn doped therein is formed on the multilayered structure 22 using the metal organic chemical vapor deposition (FIG. 2C). Specifically, the p-type current spreading layer 15 is formed by sequentially depositing the first, the second, and the third diffusion portions 15a, 15b, and 15c and the junction portion 15d while adjusting the amount of Zn to be doped therein. The p-type current spreading layer 15 has the layer thickness of about 10 μm. In the embodiment, the p-type current spreading layer 15 is made of GaP (that is, x is zero). It should be noted that the p-type current spreading layer 15 may be configured by $Ga_{1-x}In_xP$ ($0 \leq x \leq 0.1$) that includes the In composition of 10% or less, and the resulting p-type current spreading layer 15 is transparent for the wavelength of the light emitted. The growth conditions are, for example, that the growth temperature is about 800 degrees C. and the growth pressure is about 10 kPa. For example, TMGa is used as the material for the MO gas. For example, $PH_3$ is used as the V-family gas. The V/III ratio is between 30 and 200. DMZn is used as the material for the additional impurity. In the embodiment, the p-type current spreading layer 15 is configured by the four layers having Zn concentrations that are different from each other. When the four layers (the first, the second, and the third diffusion portions 15a, 15b, and 15c and the junction portion 15d) are formed, the amount of DMZn supplied is adjusted. Hydrogen is used as the carrier gas. In this embodiment, the growth temperature of the p-type current spreading layer 15 is set to be higher by about 100 degrees C. than the growth temperature of the multilayered structure 22. It should be noted, however, that this difference in the growth temperature may depend on other growth conditions and/or the off angle of the substrate for the growth. Preferably, the p-type current spreading layer 15 is formed at a growth temperature that is higher by 30 to 100 degrees C. than the growth temperature of the multilayered structure 22 when the above-described AlGaInP-based multilayered structure is formed and the current spreading layer is made of $Ga_{1-x}In_xP$ ($0 \leq x < 1$).

When the p-type current spreading layer 15 is formed, Zn is diffused from the p-type current spreading layer 15 toward the undoped active layer 21. Due to this diffusion of Zn, Zn is doped into the undoped active layer 21. As a result, the undoped active layer 21 is changed to the active layer 13 that has Zn as its p-type carrier.

An alloy of gold, germanium and nickel (AuGeNi) is vacuum-deposited over the whole back face of the n-type GaAs substrate 11 using a vacuum deposition method to form the n-side electrode 16. Resist is then applied to the p-type current spreading layer 15. Patterning is carried out to the resist such that the resist applied forms a desired electrode pattern. An alloy of gold and zinc (AuZn) is vapor-deposited in openings of the resist patterned, using a vacuum deposition method. Thereafter, the p-side electrode 17 of a desired shape is formed by removing the resist (lift-off method) (FIG. 2D). With the completion of this process step, the semiconductor light-emitting apparatus 10 is obtained.

The diffusion of Zn in the semiconductor light-emitting apparatus 10 will be described. FIG. 3 is a graph of the Zn concentration in the semiconductor light-emitting apparatus 10 manufactured according to the process of FIG. 2A to FIG. 2D. In the illustrated embodiment, the Zn concentration is equal to the p-type carrier concentration.

Figure 3:
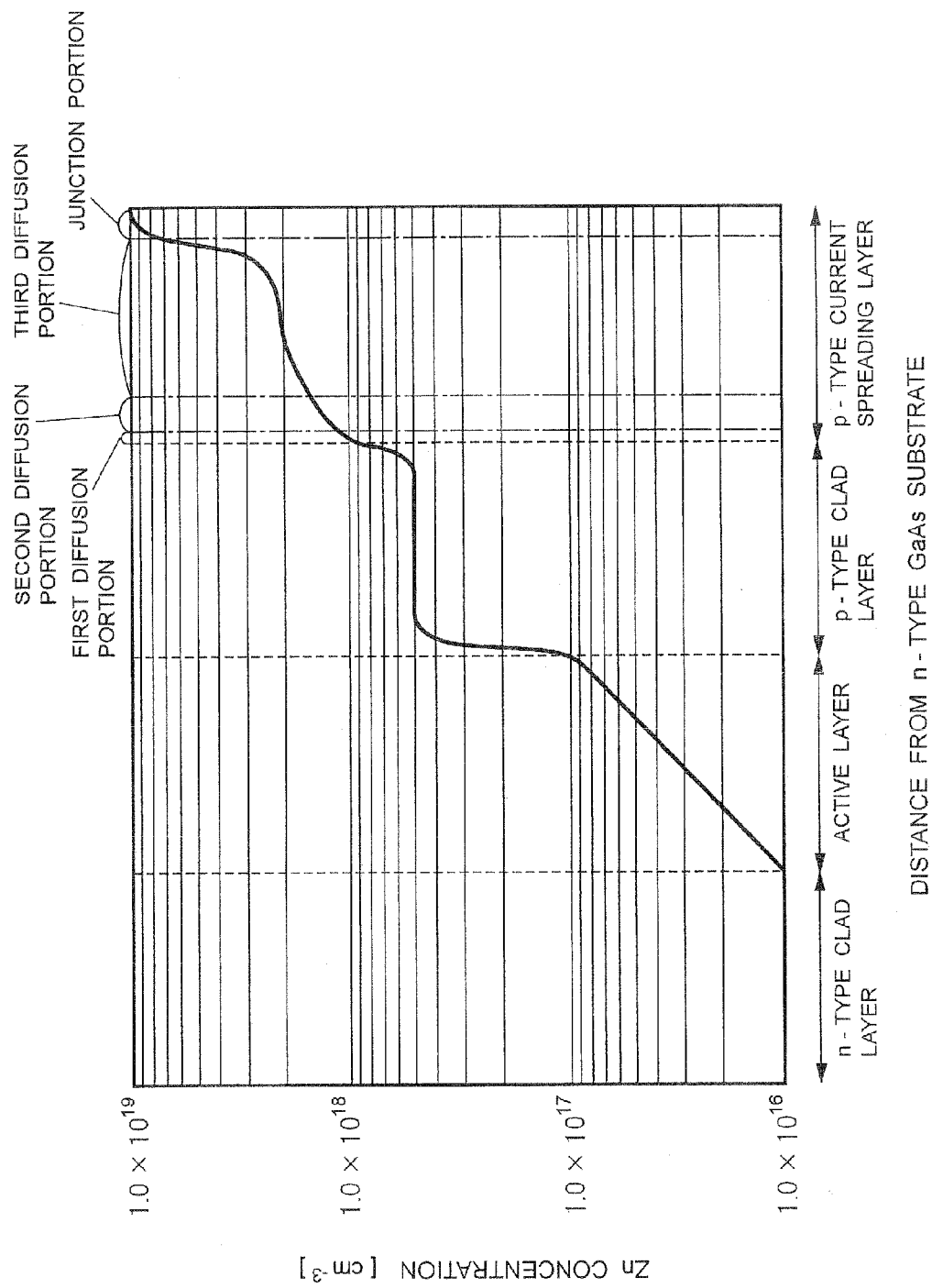
FIG. 3 is a graph of Zn concentration in the semiconductor light-emitting apparatus shown in FIG. 1.

FIG. 3 shows that the Zn concentration in the semiconductor light-emitting apparatus 10 gradually increases with the distance from the n-type GaAs substrate 11. The Zn concentration in the active layer 13 is in a range of from $1 \times 10^{16}$ to $1 \times 10^{17}$ $cm^{-3}$ and the average Zn concentration thereof is $3 \times 10^{16}$ $cm^{-3}$. The Zn concentration in the p-type clad layer 14 is about $5 \times 10^{17}$ $cm^{-3}$ and the average Zn concentration thereof is $5 \times 10^{17}$ $cm^{-3}$. In the p-type current spreading layer 15, the average Zn concentration of the first diffusion portion 15a is about $1 \times 10^{18}$ $cm^{-3}$, that of the second diffusion portion 15b is about $1.5 \times 10^{18}$ $cm^{-3}$, that of the third diffusion portion 15c is about $2 \times 10^{18}$ $cm^{-3}$, and that of the junction portion 15d is about $1 \times 10^{19}$ $cm^{-3}$. The average Zn concentration of the p-type current spreading layer 15 is about $3 \times 10^{18}$ $cm^{-3}$. The Zn concentration of the p-type current spreading layer 15 gradually decreases with the distance from the upper surface of the p-type current spreading layer 15 (the distance is taken from the upper surface of the layer 15 to the lower surface of the layer 15 or the boundary between the p-type current spreading layer 15 and the p-type clad layer 14). Si is doped in the n-type clad layer 12 and no Zn is diffused therein.

By adjusting the Zn profile in the p-type current spreading layer 15 to be the profile depicted in FIG. 3, the average Zn concentration of the active layer 13 can be adjusted to between $2 \times 10^{16}$ cm$^{-3}$ and $4–10^{16}$ cm$^{-3}$. The reason for this will be described.

Generally, the diffusion of Zn in the third diffusion portion 15c having the largest layer thickness most influences the amount of Zn diffused from the p-type current spreading layer 15 to the p-type clad layer 14. However, the diffusion of Zn in the third diffusion portion 15c is suppressed by the second diffusion portion 15b whose Zn concentration is lower than that of the third diffusion portion 15c. It is considered that the suppression of the diffusion of Zn in the third diffusion portion 15c suppresses the amount of Zn diffused from the p-type current spreading layer 15 to the p-type clad layer 14, and this controls the average Zn concentration of the active layer 13 to be in the range from $2 \times 10^{16}$ to $4 \times 10^{16}$ cm$^{-3}$. Therefore, it is important to adjust the layer thickness and the amount of doped Zn of each of the first, second and third diffusion portions 15a, 15b, and 15c such that the Zn concentration in the p-type current spreading layer 15 gradually decreases with the distance from the upper surface of the p-type current spreading layer 15 toward the boundary between the p-type current spreading layer 15 and the p-type clad layer 14, as depicted in FIG. 3. For example, the average Zn concentration of the first diffusion portion 15a can be adjusted in a range of from $1 \times 10^{18}$ to $5 \times 10^{18}$ cm$^{-3}$, that of the second diffusion portion 15b can be adjusted in a range of from $1 \times 10^{16}$ to $5 \times 10^{18}$ cm$^{-3}$, and that of the third diffusion portion 15c can be adjusted in a range of from $1 \times 10^{18}$ to $5 \times 10^{18}$ cm$^{-3}$. The junction portion 15d is a layer that is formed to obtain the ohmic contact with the p-side electrode 17 and, therefore, gives no influence on the diffusion of Zn. It should be noted that if a sufficient ohmic contact is provided or given between the third diffusion portion 15c and the p-side electrode 17, then the junction portion 15d may be dispensed with.

The fact that the semiconductor light-emitting apparatus 10 manufactured by the above-described manufacturing method (FIG. 2A to FIG. 2D) possesses a high luminous efficiency will be explained in detail with reference to FIG. 4.

Figure 4:
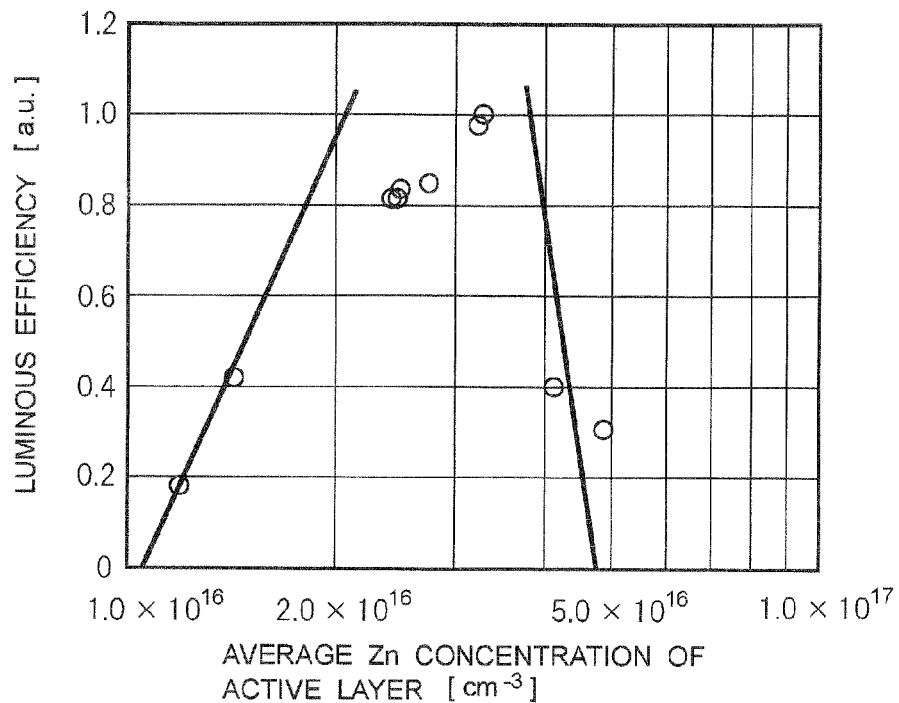
FIG. 4 is a graph showing the relation between the average Zn concentration of an active layer and luminous efficiency.

FIG. 4 shows the luminous efficiencies of a plurality of semiconductor light-emitting apparatus having different average Zn concentration in the active layer 13. In FIG. 4, the axis of abscissa represents the average Zn concentration of the active layer 13 and the axis of ordinate represents the luminous efficiency. The unit of the luminous efficiency on the vertical axis is arbitrary. In FIG. 4, a sample whose average Zn concentration is $5 \times 10^{16}$ cm$^{-3}$ is taken as a reference (that is, "1.0"). The horizontal axis employs logarithmic representation.

As can be seen from FIG. 4, in the case where the average Zn concentration in the active layer 13 is lower than $2.0 \times 10^{16}$ cm$^{-3}$, the luminous efficiency steeply decreases as the average Zn concentration decreases. In the case where the average Zn concentration is higher than $4.0 \times 10^{16}$ cm$^{-3}$, the luminous efficiency steeply decreases as the average Zn concentration increases. Stable luminous efficiency can be obtained when the average Zn concentration is in a range of $2.0 \times 10^{16}$ to $4.0 \times 10^{16}$ cm$^{-3}$, and the peak of the luminous efficiency is present in this range. From these observations, it is understood that the average Zn concentration of the active layer 13 needs to be adjusted to between $2 \times 10^{16}$ and $4 \times 10^{16}$ cm$^{-3}$ to reduce the variation of the luminous efficiency among a plurality of semiconductor light-emitting apparatus and achieve high luminous efficiency.

In the semiconductor light-emitting apparatus 10, the average Zn concentration of the active layer 13 is adjusted to between $2 \times 10^{16}$ and $4 \times 10^{16}$ cm$^{-3}$ by configuring the p-type current spreading layer 15 with the four-layer structure. The average Zn concentration of the active layer 13 is adjusted to a range necessary for acquiring the high luminous efficiency (between $2 \times 10^{16}$ and $4 \times 10^{16}$ cm$^{-3}$ in FIG. 4) and, therefore, a semiconductor light-emitting apparatus 10 having high luminous efficiency can be manufactured.

Conditions and reasons therefor to manufacture a semiconductor light-emitting apparatus that is highly reliable using the above-described manufacturing method will be described with reference to FIGS. 5 to 9.

Figure 5:
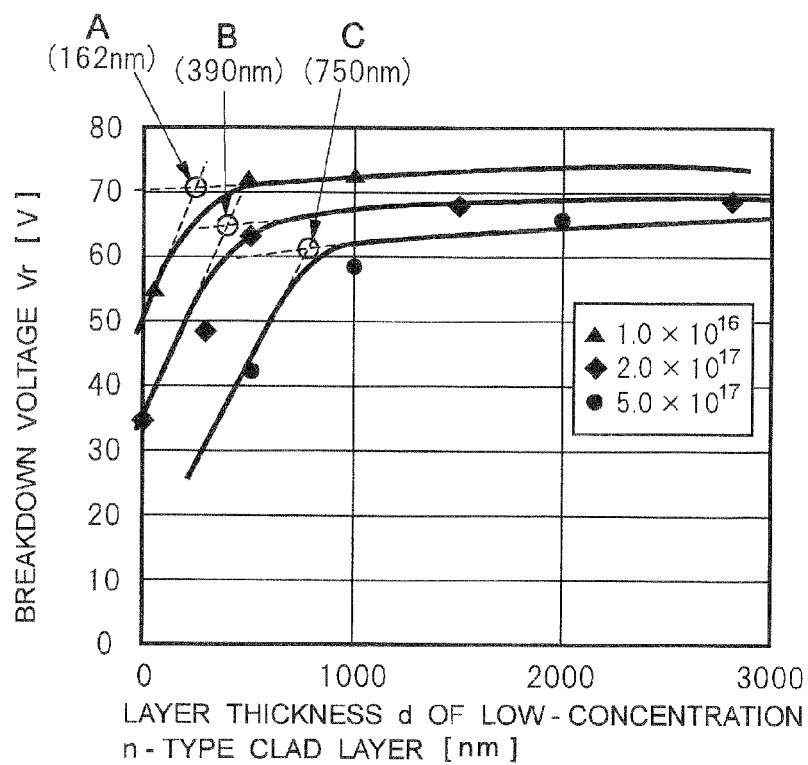
FIG. 5 illustrates the relation between the layer thickness of a low-concentration n-type clad layer and a breakdown voltage.

FIG. 5 depicts values of the breakdown voltage Vr acquired when the layer thickness of the low-concentration n-type clad layer 12b is varied. In FIG. 5, the axis of abscissa represents the layer thickness [nm] of the low-concentration n-type clad layer 12b and the axis of ordinate represents the breakdown voltage Vr [V]. Three kinds of semiconductor light-emitting apparatuses (samples) having different average Si concentrations in the low-concentration n-type clad layer 12b (namely, $1 \times 10^{16}$, $2 \times 10^{17}$, and $5 \times 10^{17}$ cm$^{-3}$) were used in the measurement of the relation between the layer thickness of the low-concentration n-type clad layer 12b and the breakdown voltage Vr. The measurement of the breakdown voltage was carried out by energizing each of the samples with a current of 10A in the reverse direction.

As illustrated in FIG. 5, a semiconductor light-emitting apparatus having a higher breakdown voltage Vr was obtained by increasing the layer thickness of the low-concentration n-type clad layer 12b. Specifically, for any one of the samples, the breakdown voltage Vr steeply increased with the increasing layer thickness "d" of the low-concentration n-type clad layer 12b from 0 nm to a certain value, and the breakdown voltage Vr saturated from that "certain value." This shows that the width of a depletion layer increases with an increase of the layer thickness "d" of the low-concentration n-type clad layer 12b until a certain thickness is reached, and that the width of the depletion layer does not increase with the layer thickness of the low-concentration n-type clad layer 12b from that thickness. From these observations, the low-concentration n-type clad layer 12b has a critical layer thickness, with which a particular breakdown voltage Vr can be obtained without depending on the layer thickness.

The critical layer thickness was calculated in a manner described below. An approximate curve (depicted by a solid line in FIG. 5) was produced for each average Si concentration from plots of the sample. Then, an intersection was calculated of a tangential line (depicted by a dotted line) of the plots in the range of each approximate curve within which the breakdown voltage Vr steeply increases, and another tangential line (depicted by a dotted line) of the plots in the range within which the breakdown voltage Vr saturates. The intersection acquired for the average Si concentration of $1 \times 10^{16}$ cm$^{-3}$ was denoted by "intersection A." The intersection acquired for the average Si concentration of $2 \times 10^{17}$ cm$^{-3}$ was denoted by "intersection B." The intersection acquired for the average Si concentration of $5 \times 10^{17}$ cm$^{-3}$ was denoted by "intersection C." The layer thicknesses at the intersections A, B and C were the critical layer thicknesses and were about 162 nm, about 390 nm, and about 750 nm respectively for the intersections A, B and C.

Figure 6:
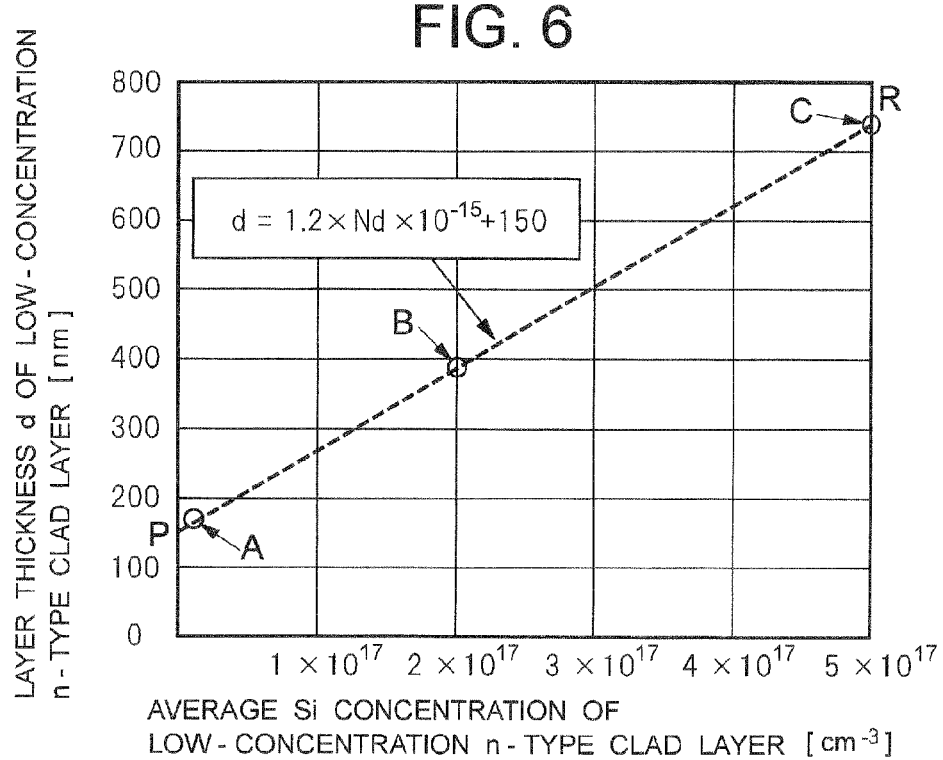
FIG. 6 depicts the relation between the average Si concentration of the low-concentration n-type clad layer and the layer thickness thereof.

FIG. 6 shows the intersections A, B and C calculated from FIG. 5 when the intersections A, B and C are plotted on a graph whose axis of abscissa represents the average Si concentration [cm$^{-3}$] of the low-concentration n-type clad layer 12b and whose axis of ordinate represents the layer thickness [nm] thereof. As can be seen from FIG. 6, the intersections A, B and C reside on a straight line PR (depicted by a dotted line). A calculation of the straight line PR based on the intersections A, B and C gives Equation (1) below.

$$d = 1.2 \times N_{d1} \times 10^{-15} + 150 \quad (1)$$

Equation (1) defines the critical layer thickness with which the breakdown voltage Vr does not increase even when the layer thickness of the low-concentration n-type clad layer 12b exceeds that value in FIG. 5. "$N_{d1}$" is the average Si concentration [cm$^{-3}$] of the low-concentration n-type clad layer 12b and "d" is the layer thickness [nm] of the low-concentration n-type clad layer 12b. From the foregoing description, it is understood that the Equation (2) only has to be satisfied to obtain a constant breakdown voltage Vr without depending on the layer thickness of the low-concentration n-type clad layer 12b.

$$d \geq 1.2 \times N_{d1} \times 10^{-15} + 150 \tag{2}$$

As can be seen from FIG. 5, when the Equation (2) is satisfied, a common standard specification (or requirement) for highly reliable product (the breakdown voltage Vr of 50 V or higher) is also satisfied.

Figure 7:
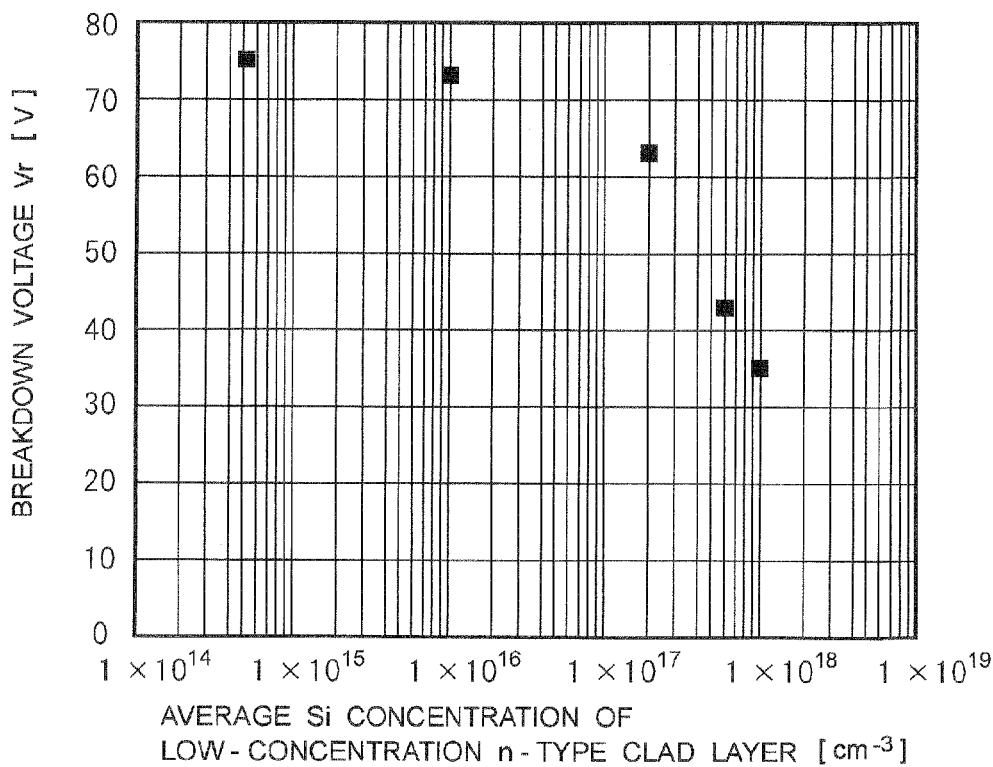
FIG. 7 is a graph of the relation between the average Si concentration of the low-concentration n-type clad layer and the breakdown voltage.

FIG. 7 depicts the relation between the average Si concentration of the low-concentration n-type clad layer 12b and the breakdown voltage Vr when the thickness of the low-concentration n-type clad layer 12b is 500 nm. In FIG. 7, the axis of abscissa represents the average Si concentration [cm$^{-3}$] of the low-concentration n-type clad layer 12b and the axis of ordinate represents the breakdown voltage Vr [V]. Five samples were used for breakdown voltage measurement. The measurement of the breakdown voltage was carried out by energizing each of the five semiconductor light-emitting apparatuses whose average Si concentrations were different from each other ($5 \times 10^{14}$, $1 \times 10^{16}$, $2 \times 10^{17}$, $5 \times 10^{17}$ and $1 \times 10^{18}$ cm$^{-3}$) with a current of 10 μA in the reverse direction. The measurement results are shown in FIG. 7.

The breakdown voltage Vr decreased as the average Si concentration of the low-concentration n-type clad layer 12b increased as shown in FIG. 7. Specifically, when the average Si concentration was about $2 \times 10^{17}$ cm$^{-3}$ or lower, the breakdown voltage Vr substantially did not vary, i.e., it saturated. When the average Si concentration was in a range of $2 \times 10^{17}$ cm$^{-3}$ or lower satisfying the Equation (2), the breakdown voltage Vr at the saturated level could be obtained. When the average Si concentration was $5 \times 10^{17}$ or $1 \times 10^{18}$ cm$^{-3}$ not satisfying the Equation (2), on the other hand, only a low breakdown voltage was obtained.

When the average Si concentration of the low-concentration n-type clad layer 12b is made lower, a series resistance component of the semiconductor light-emitting apparatus increases, and a problem arises (i.e., an increase of the operational voltage). In this viewpoint, the average Si concentration of the low-concentration n-type clad layer 12b needs to be set as high as possible.

Therefore, preferably the average Si concentration of the low-concentration n-type clad layer 12b is set to be about $1 \times 10^{16}$ to $5 \times 10^{17}$ cm$^{-3}$ to suppress the variation of the breakdown voltage Vr and the increase of the operational voltage.

Figure 8:
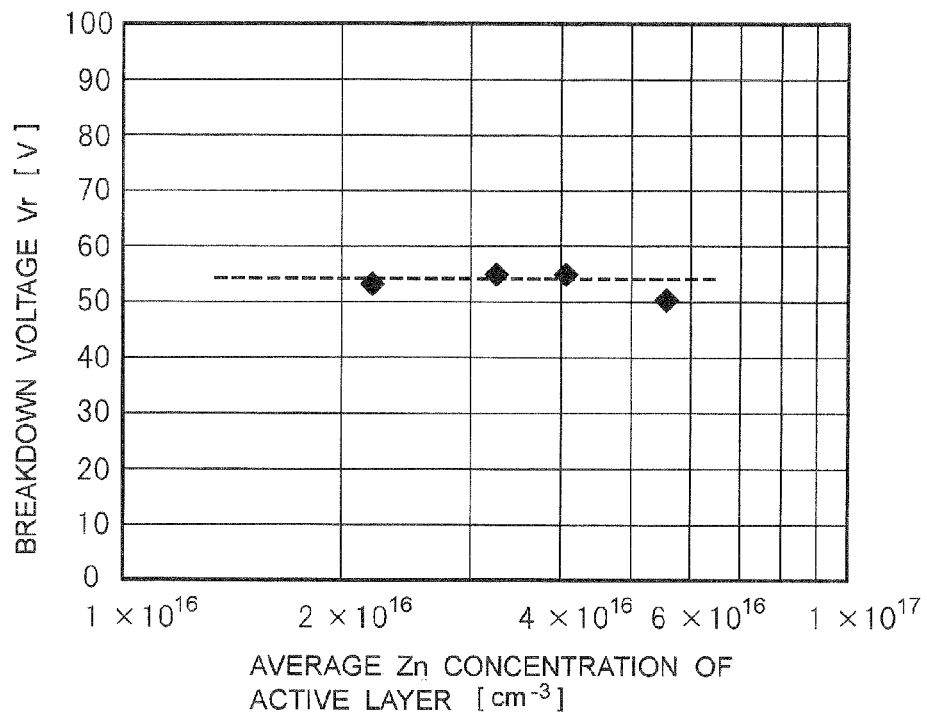
FIG. 8 is a graph of the relation between the average Zn concentration of the active layer and the breakdown voltage of the semiconductor light-emitting apparatus shown in FIG. 1.

FIG. 8 illustrates the relation between the average Zn concentration in the active layer and the breakdown voltage Vr of the semiconductor light-emitting apparatus according to the embodiment (main sample). The main sample includes the n-type clad layer 12 that is configured by the high-concentration n-type clad layer 12a (whose average Si concentration is $1 \times 10^{18}$ cm$^{-3}$ and whose layer thickness is 2.5 μm) and the low-concentration n-type clad layer 12b (whose average Si concentration is $2 \times 10^{17}$ cm$^{-3}$ and whose layer thickness is 0.5 μm).

Figure 9:
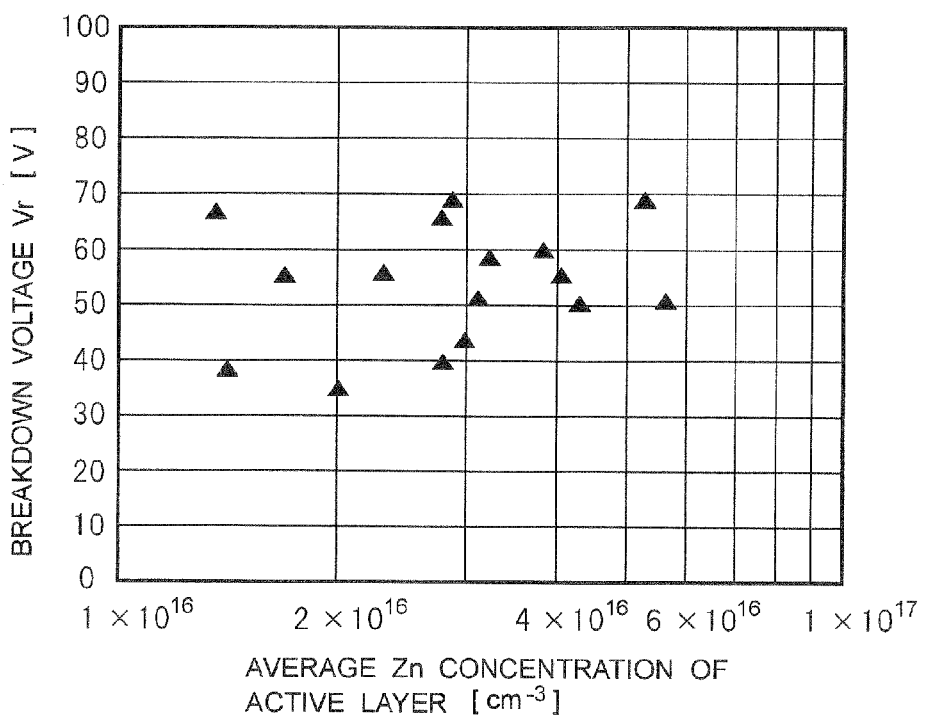
FIG. 9 is a graph of the relation between the average Zn concentration of an active layer and a breakdown voltage of comparative samples.

On the other hand, FIG. 9 depicts the relation between the average Zn concentration in an active layer and a breakdown voltage Vr of a semiconductor light-emitting apparatus that is differently structured from the semiconductor light-emitting apparatus of the embodiment (a comparative sample). The structure of the comparative sample only differs in the structure of the n-type clad layer compared to the main sample and other structures thereof are same as those of the main sample. Specifically, the comparative sample includes an n-type clad layer having a single-layer structure (whose average Si concentration is $1 \times 10^{18}$ cm$^{-3}$ and whose layer thickness is 3 μm).

The axis of abscissa of each of FIGS. 8 and 9 represents the average Zn concentration [cm$^{-3}$] in the active layer and the axis of ordinate thereof represents the breakdown voltage Vr [V]. The measurement of the breakdown voltage was carried out by energizing each of the main samples and the comparative samples whose average Zn concentrations in the active layers were different from each other with a current of 10 A in the reverse direction.

As shown in FIGS. 8 and 9, the measured breakdown voltages Vr of the main samples were constant regardless of the average Zn concentrations in the active layers 13. On the other hand, the measured breakdown voltages Vr of the comparative samples had variations regardless of the average Zn concentrations.

The following can be considered as the reason for the above-described different results between the main samples and comparative samples. Generally, the width of the depletion layer that influences the value of the breakdown voltage Vr is sensitive to the average Zn concentration in the active layer and the shape of its profile and, therefore, it is considered difficult to accurately control the average Zn concentration in the active layer and the shape of its profile. Accordingly, the comparative samples had variations of about 40 V even though the average Zn concentration of the active layer was in a range (from $2 \times 10^{16}$ to $4 \times 10^{16}$ cm$^{-3}$) with which high luminous efficiency was obtained as shown in FIG. 9.

The n-type clad layer of the main sample is configured by the two layers having the average Si concentrations that are different from each other, and the main sample satisfies the Equation (2). Therefore, the breakdown voltage Vr is constant without depending on the layer thickness of the low-concentration n-type clad layer 12b. It is considered that the layer thickness of the low-concentration n-type clad layer 12b is set to be equal or larger than the critical layer thickness with which the constant breakdown voltage Vr can be obtained and, therefore, the expansion of the width of the depletion layer has reached its maximum (the width that does not expand any more). Thus, it is considered that even when some variations are actually present in the average Zn concentrations of the active layers and the shape of its profile, no significant variations appear in the width of the depletion layer and consequently the semiconductor light-emitting apparatus whose breakdown voltage Vr have small variations can easily be manufactured. The diffusion coefficient of Si is smaller than that of Zn in AlGaInP, and Si is highly controllable. Thus, the control of the Si concentration and layer thickness is easier than the control of the average Zn concentration in the active layer and the shape of its profile. The Si concentration and layer thickness are controlled to satisfy the Equation (2).

Preferred manufacturing conditions for the high-concentration n-type clad layer 12a will be described. The high-concentration n-type clad layer 12a is spaced from the active layer 14 by a distance equal to the layer thickness of the low-concentration n-type clad layer 12b and Si substantially does not diffuse in AlGaInP. Therefore, it is considered that the high-concentration n-type clad layer 12a does not influence the breakdown voltage Vr. Accordingly, the average Si concentration of the high-concentration n-type clad layer 12a only has to be higher than the average Si concentration of the low-concentration n-type clad layer 12b. However, when the current spreading and a forward voltage Vf are taken into consideration, it is preferred that the average Si concentration of the high-concentration n-type clad layer 12a is in a range of $1\times10^{18}$ to $5\times10^{18}$ cm$^{-3}$ and the total of the layer thicknesses of the high-concentration and the low-concentration n-type clad layers 12a and 12b is equal to or greater than one μm. This is because the forward voltage Vf increases and the power consumption of the semiconductor light-emitting apparatus increases when the average Si concentration is lower than $1\times10^{18}$ cm$^{-3}$. Another reason is because the light absorption of the high-concentration n-type clad layer 12a increases when the average Si concentration exceeds $5\times10^{18}$ cm$^{-3}$.

As described above, the semiconductor light-emitting apparatus 10 of the present invention includes the n-type clad layer 12 that is configured by the n-type high-concentration glad layer 12a and the n-type low-concentration clad layer 12b whose average Si concentration is lower than that of the n-type high-concentration clad layer 12a. Denoting the layer thickness of the n-type low-concentration clad layer 12b as "d" (nm) and the average Si concentration of the clad layer 12b as "$N_{d1}$" (cm$^{-3}$), then the relation of "$d \geq 1.2 \times N_{d1} \times 10^{15} + 150$" is satisfied. Thus, a constant breakdown voltage Vr can be obtained without depending on the layer thickness of the n-type low-concentration clad layer 12b.

The semiconductor light-emitting apparatus 10 of the present invention includes the active layer 13 whose average Zn concentration is between $2\times10^{16}$ and $4\times10^{16}$ cm$^{-3}$ and therefore has high luminous efficiency.

The semiconductor light-emitting apparatus 10 of the present invention includes the above-described structures. Therefore, the semiconductor light-emitting apparatus 10 has high luminous efficiency and a high breakdown voltage Vr. Further, the semiconductor light-emitting apparatus 10 have small variations in the breakdown voltage Vr among lots. The process of manufacturing the semiconductor light-emitting apparatus 10 of the present invention is carried out such that the semiconductor light-emitting apparatus 10 includes the above-described structures. Thus, the manufacturing method provides the semiconductor light-emitting apparatus 10 that possesses high luminous efficiency and a high breakdown voltage Vr. Also, the manufacturing method reduces the variations in the breakdown voltage Vr among lots.

It should be noted that the above-described semiconductor light-emitting apparatus 10 and the manufacturing method therefor are only examples, and the present invention is not limited to the above-described apparatus 10 and its method. For example, although the composition of the n-type clad layer 12 is $(Al_{0.7}Ga_{0.3})_{0.5}In_{0.5}P$ in the illustrated embodiment, $Al_{0.5}In_{0.5}P$ including Ga of 0% may be used as long as this material is transparent for the active layer 13. In addition, the compositions of the high-concentration and low-concentration n-type clad layers 12a and 12b may be different from each other. For example, the compositions of the high-concentration and the low-concentration n-type clad layers 12a and 12b may be $(Al_{0.7}Ga_{0.3})_{0.5}In_{0.5}P$ and $(Al_{0.5}Ga_{0.5})_{0.5}In_{0.5}P$, respectively.

Although DMZn is used in the illustrated embodiment as the additional material of the p-type impurity, $Cp_2Mg$ (biscyclopentadienyl magnesium) may instead be used. Although silane ($SiH_4$) is used in the embodiment as the additional material of the n-type impurity, DeTe (diethyl tellurium) or $H_2Se$ (hydrogen selenide) may instead be used.

The semiconductor light-emitting apparatus may be manufactured exchanging the n and p types for each other. The substrate 11 for the growth is not limited to the 15-degree-off substrate and, for example, a 4-degree-off substrate may also be used. In such a case, the p-type current spreading layer 15 is grown at a temperature higher by 30 to 100 degrees C. than the growth temperature of the multilayered structure 22. The average Zn concentration of the p-type current spreading layer 15 can also be adjusted within a range of $1\times10^{18}$ to $5\times10^{18}$ cm$^{-3}$.

Although the semiconductor light-emitting apparatus 10 according to the embodiment (FIG. 1 to FIG. 2D) includes the n-type GaAs substrate 11 that is the substrate for the growth, the semiconductor light-emitting apparatus may not have the substrate 11. Specifically, the semiconductor light-emitting apparatus may be made by, after FIG. 2C, laminating the p-type current spreading layer 15 with a supporting substrate other than the substrate for the growth and removing the n-type GaAs substrate 11. The resulting semiconductor light-emitting apparatus may include the p-type current spreading layer 15, the p-type clad layer 14, the active layer 13, the low-concentration n-type clad layer 12b, and the high-concentration n-type clad layer 12a deposited on the supporting substrate. Even for this semiconductor light-emitting apparatus, the variation of the breakdown voltage Vr can be suppressed by employing the above-described structure of the n-type clad layer 12.

In order to have the average Zn concentration of the active layer between $2\times10^{16}$ and $4\times10^{16}$ cm$^{-3}$ in the illustrated embodiment, the p-type current spreading layer 15 of the light emitting device 10 has the four-layer structure, and the average Zn concentration is adjusted to the above-mentioned concentration range (between $2\times10^{16}$ and $4\times10^{16}$ cm$^{-3}$) using the diffusion of Zn. However, the average Zn concentration adjustment may also be achieved in the following manner. For example, the p-type current spreading layer 15 may have a two-layer structure that is made from a diffusion portion (whose average Zn concentration is $1\times10^{18}$ to $5\times10^{-18}$ cm$^{-3}$ and whose layer thickness is 2.5 μm) and a joining portion (whose average Zn concentration is $1\times10^{19}$ cm$^{-3}$ and whose layer thickness is 0.5 μm), and the average Zn concentration may be adjusted to the above-mentioned concentration range (between $2\times10^{16}$ and $4\times10^{16}$ cm$^{-3}$) using the diffusion of Zn. A p-type diffusion control layer (whose average Zn concentration is, for example, $1\times10^{17}$ to $1\times10^{18}$ cm$^{-3}$) may be formed before forming the p-type current spreading layer having the four-layer or two-layer structure. This makes it possible to control the Zn concentration in the active layer more precisely.

This application is based on Japanese Patent Application No. 2010-31295 filed on Feb. 16, 2010, and the entire disclosure thereof is incorporated herein by reference.

What is claimed is:

1. A semiconductor light-emitting apparatus comprising:
   a semiconductor substrate;
   a first clad layer that is formed on the semiconductor substrate, the first clad layer having a first conducting type;
   a second clad layer that is formed on the first clad layer, the second clad layer having the first conducting type, the second clad layer having an average dopant concentration lower than that of the first clad layer;
   an active layer that is formed on the second clad layer, the active layer having an average dopant concentration of $2\times10^{16}$ to $4\times10^{16}$ cm$^{-3}$, the active layer made from $(Al_yGa_{1-y})_xIn_{1-x}P$ ($0<x\leq1$, $0\leq y\leq1$);
   a third clad layer that is formed on the active layer, the third clad layer having a second conducting type; and a second-conducting-type semiconductor layer that is formed on the third clad layer, the second-conducting-type semiconductor layer made from $Ga_{1-x}In_xP$ ($0 \leq x < 1$), wherein $$d \geq 1.2 \times N_{d1} \times 10^{-15} + 150$$

is satisfied where d is a layer thickness of the second clad layer (nm) and $N_{d1}$ is the average dopant concentration of the second clad layer ($cm^{-3}$).

2. The semiconductor light-emitting apparatus of claim 1, wherein the dopant concentration of the second clad layer is $5 \times 10^{17}$ $cm^{-3}$ or lower.

3. The semiconductor light-emitting apparatus of claim 1, wherein the dopant concentration of the second clad layer is $1 \times 10^{16}$ to $2 \times 10^{-17}$ $cm^{-3}$.

4. The semiconductor light-emitting apparatus of claim 1, wherein the dopant concentration of the first clad layer is $1 \times 10^{18}$ to $5 \times 10^{18}$ $cm^{-3}$.

5. The semiconductor light-emitting apparatus of claim 1, wherein a total of layer thickness of the first and second clad layers is one micrometer or greater.

6. The semiconductor light-emitting apparatus of claim 1, wherein the dopant concentrations of the active layer, the third clad layer, and the second-conducting-type semiconductor layer decrease from the second-conducting-type semiconductor layer toward the active layer.

7. The semiconductor light-emitting apparatus of claim 1, wherein said second-conducting-type semiconductor layer has a four-layer structure, with four layers having different Zn concentrations from each other.

8. A manufacturing method of a semiconductor light-emitting apparatus, comprising:
   preparing a substrate for growth;
   forming a multilayered structure by sequentially growing:
      a first clad layer on the substrate for growth, the first clad layer having a first conducting type,
      a second clad layer on the first clad layer, the second clad layer having the first conducting type, the second clad layer having an average dopant concentration lower than that of the first clad layer,
      an active layer on the second clad layer, the active layer being not doped, the active layer made from $(Al_yGa_{1-y})_xIn_{1-x}P$ ($0 < x \leq 1$, $0 \leq y \leq 1$), and
      a third clad layer on the active layer, the third clad layer having a second conducting type; and
   controlling an average dopant concentration of the active layer to be between $2 \times 10^{16}$ and $4 \times 10^{16}$ $cm^{-3}$ by growing a second-conducting-type semiconductor layer at a growth temperature that is higher than a growth temperature of the multilayered structure and by causing a dopant of the second conducting type to diffuse from the second clad layer to the active layer, wherein $$d \geq 1.2 \times N_{d1} \times 10^{-15} + 150$$

is satisfied where d is a layer thickness of the second clad layer (nm) and $N_{d1}$ is the average dopant concentration of the second clad layer ($cm^{-3}$).

9. The manufacturing method of claim 8, wherein the growth temperature of the second-conducting-type semiconductor layer is higher by 30 to 100 degrees C. than the growth temperature of the multilayered structure.

10. The manufacturing method of claim 8, further comprising:
   laminating a supporting substrate on the second-conducting-type semiconductor layer through a joining member; and
   removing the substrate for the growth from the multilayered structure.

11. The manufacturing method of claim 8, wherein said forming a multilayered structure is carried out by MOCVD (Metal Organic Chemical Vapor Deposition).

12. The manufacturing method of claim 8, wherein said y for the third clad layer is between 0.6 and 0.8.

13. The manufacturing method of claim 8, wherein said x for the active layer is between 0.4 and 0.6, and said y is between 0 and 0.7.

14. The manufacturing method of claim 8, wherein said active layer is made with a growth temperature between 500 and 700 degrees C., said x is between 0.45 and 0.55 and said y is between 0.3 and 1.

15. The manufacturing method of claim 8, wherein said second-conducting-type semiconductor layer has a four-layer structure, with four layers having different Zn concentrations from each other.

16. The manufacturing method of claim 8, wherein said x for the first clad layer is between 0.4 and 0.6, and said y is between 0.4 and 1.0.

17. The manufacturing method of claim 8, wherein said x for the second clad layer is between 0.4 and 0.6, and said y is between 0.4 and 1.0.

18. A light-emitting apparatus comprising:
   a substrate;
   a first clad layer that is formed on the substrate, the first clad layer having a first conducting type;
   an active layer that is formed on the first clad layer, the active layer having an average dopant concentration of $2 \times 10^{16}$ to $4 \times 10^{16}$ $cm^{-3}$, the active layer made from $(Al_yGa_{1-y})_xIn_{1-x}P$ ($0 < x \leq 1$, $0 \leq y \leq 1$);
   a second clad layer that is formed on the active layer, the second clad layer having a second conducting type; and
   a second-conducting-type semiconductor layer that is formed on the second clad layer, the second-conducting-type semiconductor layer made from $Ga_{1-x}In_xP$ ($0 \leq x < 1$), wherein the first clad layer includes an upper clad layer and a lower clad layer, the lower clad layer is formed on the substrate, the upper clad layer is formed on the lower clad layer, the active layer is formed on the upper clad layer, the upper clad layer has an average dopant concentration lower than that of the lower clad layer, and $$d \geq 1.2 \times N_{d1} \times 10^{-15} + 150$$

is satisfied where d is a layer thickness of the upper clad layer (nm) and $N_{d1}$ is the average dopant concentration of the upper clad layer ($cm^{-3}$).

19. The light-emitting apparatus of claim 18, wherein the dopant concentration of the upper clad layer is $5 \times 10^{17}$ $cm^{-3}$ or lower.

20. The light-emitting apparatus of claim 18, wherein the dopant concentration of the upper clad layer is $1 \times 10^{16}$ to $2 \times 10^{17}$ $cm^{-3}$.

21. The light-emitting apparatus of claim 18, wherein the dopant concentration of the lower clad layer is $1 \times 10^{18}$ to $5 \times 10^{18}$ $cm^{-3}$.

22. The light-emitting apparatus of claim 18, wherein a thickness of the first clad layer is one micrometer or greater.

* * * * *